United States Patent [19]

Atanassov et al.

[11] Patent Number: 4,558,408

[45] Date of Patent: Dec. 10, 1985

[54] MANUAL CRATE CONTROLLER

[75] Inventors: Lyuben P. Atanassov; Eliezer H. Kohen; Vladimir D. Maleshkov, all of Plovdiv; Dimo P. Antonov, Sofia; Lyubomir S. Russev, Plovdiv; Georgi A. Georgiev, Plovdiv, all of Bulgaria

[73] Assignee: Obedineni Zavodi za Zapametyavashti Ustroystva, Plovdiv, Bulgaria

[21] Appl. No.: 524,365

[22] Filed: Aug. 18, 1983

[30] Foreign Application Priority Data

Aug. 18, 1982 [BG] Bulgaria .................................. 57769

[51] Int. Cl.⁴ ............................................ G06F 15/46
[52] U.S. Cl. .................................... 364/130; 364/602; 364/900
[58] Field of Search ............... 364/130, 137, 138, 600, 364/602, 200, 900

[56] References Cited

U.S. PATENT DOCUMENTS 4,047,159 9/1977 Boudry ................................ 364/900
4,155,116 5/1979 Tawtik et al. ...................... 364/138

*Primary Examiner*—Jerry Smith
*Assistant Examiner*—Louis Woo

[57] ABSTRACT

A manual crate controller for debugging and testing of CAMAC-modules (CAMAC is an acronym for computer automated measurement and control, an internationally accepted standard for interfacing modular instrumentation with computers through a bused back plane called a dataway) with capabilities for executing a large number of commands with full synchronization in conformity with CAMAC-modes for data exchange, that finds application in minicomputers using the CAMAC-standard. The manual crate controller includes a working and a control station. The latter includes a control panel, a program memory for storing commands entered with keys on the control panel and a start-up logic block. The working station contains a data memory with data inputs connected to the data buses of the CAMAC-main bus, and an input logic with inputs connected to the two most significant buses for function, and to the buses for "BUSY", initiation, resetting, first-strobe and second-strobe of the CAMAC-main bus. The manual crate controller has the following modes of operation: automatic, cyclic and single action. The execution of the commands is fully synchronized in conformity with CAMAC-modes for data exchange.

1 Claim, 2 Drawing Figures

MANUAL CRATE CONTROLLER

BACKGROUND OF THE INVENTION

This invention relates to a manual crate controller, that finds application in minicomputers using the CAMAC-standard (CMAC is an acronym for computer automated measurement and control, an internationally accepted standard for interfacing modular instrumentation with computers through a bused back plane called a dataway).

There is known a manual crate controller consisting of control and working stations, a pulse generator having an output connected to the clock input of a cycle generator having outputs connected to inputs of buffers, to an indicator block and to a data register. The data register is connected to data buses of the CAMAC-main bus and has outputs to the indicator block, which, in turn, has inputs connected to the status buses of the CAMAC-main bus and to the output of a circuit that receives the interrupt requests from the CAMAC-main bus. The outputs of a button-register, that determines the performed command and the data that should be recorded, are connected to the inputs of the data register, to the buffers and to a circuit for number selection, the outputs of which are, in turn, connected to the CAMAC-main bus. The outputs of the panel are connected to the inputs of the cycle generator and the data register, and the outputs of the buffers are connected to the control buses of the CAMAC-main bus.

Disadvantages of the known manual crate controllers, designed for the debugging of CAMAC-modules, are their poor technological feasibility because of the direct connections between the components—the working and the control station—and also their reduced capabilities, because of the small number of performed commands and incomplete synchronization in conformity with CAMAC-modes.

SUMMARY OF THE INVENTION

The object of this invention is to create a manual crate controller for debugging and testing of CAMAC-modules having the capability of executing a large number of commands with full synchronization in conformity with CAMAC-modes for data exchange.

This object is achieved in a manual crate controller comprising a working and a control station, the control station having a panel with program outputs connected to a program memory, an output for a cycle connected to the clock input of a D-flip-flop, an output for automatic operation connected to an input of a start-up logic, an output for single action connected to the clock input of a second D-flip-flop, an output for initiation and resetting which, in turn, is connected to a second input of the start-up logic and also to the R-input of the first D-flip-flop, to the resetting input of a first and second counter, to the input of a block with buffers and to the resolving input of a decoder, while the output for entering data from the panel is connected to the clock input of the first counter, to the control input of a multiplexer and to an input for loading the program memory. The outputs of the first counter are connected to the first inputs of a comparator and the first inputs of a multiplexer, the outputs of which are connected to the address inputs of the program memory and to the inputs of the indicators on the panel. The function and subaddress outputs of the program memory are connected to the corresponding inputs of the block with buffers and, further, the outputs for number are connected to selector inputs of the decoder and a second multiplexer, the output for normal mode is connected to a third input of the start-up logic and to an input of a third multiplexer and the output for repetition mode is connected to a second input of the third multiplexer. The buses for accepted command and response of the CAMAC-main bus are connected to the D-inputs of a two-bit register, the outputs of which are connected to the third and the fourth input of the third multiplexer, the output of which, in turn, is connected to the clock of the second counter, having outputs connected to the second inputs of the first multiplexer and to the second inputs of the first multiplexer and to the second inputs of the comparator, the comparator having an output connected to a second R-input of the first D-flip-flop and to a second resetting input of the second counter. The output of the first and the second D-flip-flop are connected to a fourth and a fifth input of the start-up logic, whose sixth input is connected to the output of the second multiplexer having inputs connected to the interrupt request buses of the CAMAC-main bus. The output of the start-up logic is connected to the inputs of two monostable multivibrators and to an input of a delay line with a monostable multivibrator, the output of which is connected to an input of a second delay line with monostable multivibrator. The output of the first monostable multivibrator is connected to a seventh input of the start-up logic and to a resolving input of the comparator, and the output of the second monostable multivibrator, in turn, is connected to a second resolving input of the comparator, to input "BUSY" of the block with buffers, and to a second resolving input of the decoder, the decoder having outputs connected to the buses for number of the CAMAC-main bus. The output of the first delay line with monostable multivibrator is connected to the clock input of the two-bit register and also to the first strobe input of the block with buffers. The output of the second delay line with monostable multivibrator is connected to the resolving input of the third multiplexer, further, to the R-input of the second D-flip-flop and to the second-strobe input of the block with buffers, the outputs of which being connected, respectively, to the function, subaddress, initiation, resetting, prohibition, busy, first-strobe and second-strobe buses of the CAMAC-main bus.

The working station contains a data memory with data inputs connected to the data buses of the CAMAC-main bus. The input logic has inputs connected to the two most significant buses for function, and to the buses for "BUSY", initiation, resetting, first-strobe, and second-strobe of the CAMAC-main bus. Outputs of the input logic are connected to the control inputs of the data memory, the resetting output is connected to the resetting input of the third counter, having the counter input thereof connected to the counter output of the input logic, the write/read outputs of which are connected to the inputs of the RS-flip-flop, having, in turn, an output connected to a third monostable multivibrator, the output of which, in turn, is connected to a second resetting input of the third counter, the outputs of which are connected to the address inputs of the data memory.

The advantages of this invention are its high technological feasibility because of the functional independence of the control and working stations connected only through the CAMAC-main bus, that allows their easily being put into operation, furthermore, the control station may be put into cycling in itself in all modes. The easy operation with the small number of keys on the panel and the simple structure provide the execution of a great number of fully synchronized commands at maximum speed and high reliability. The possibility for automatic execution of a group of commands in start-stop mode enhance its debugging capabilities.

DESCRIPTION OF THE DRAWINGS

For a better understanding of the invention and to show how it may be put into effect, reference will now be made, by way of example, to the accompanying drawings, in which.

DESCRIPTION OF THE PREFERRED EMBODIMENT

Figure 1:
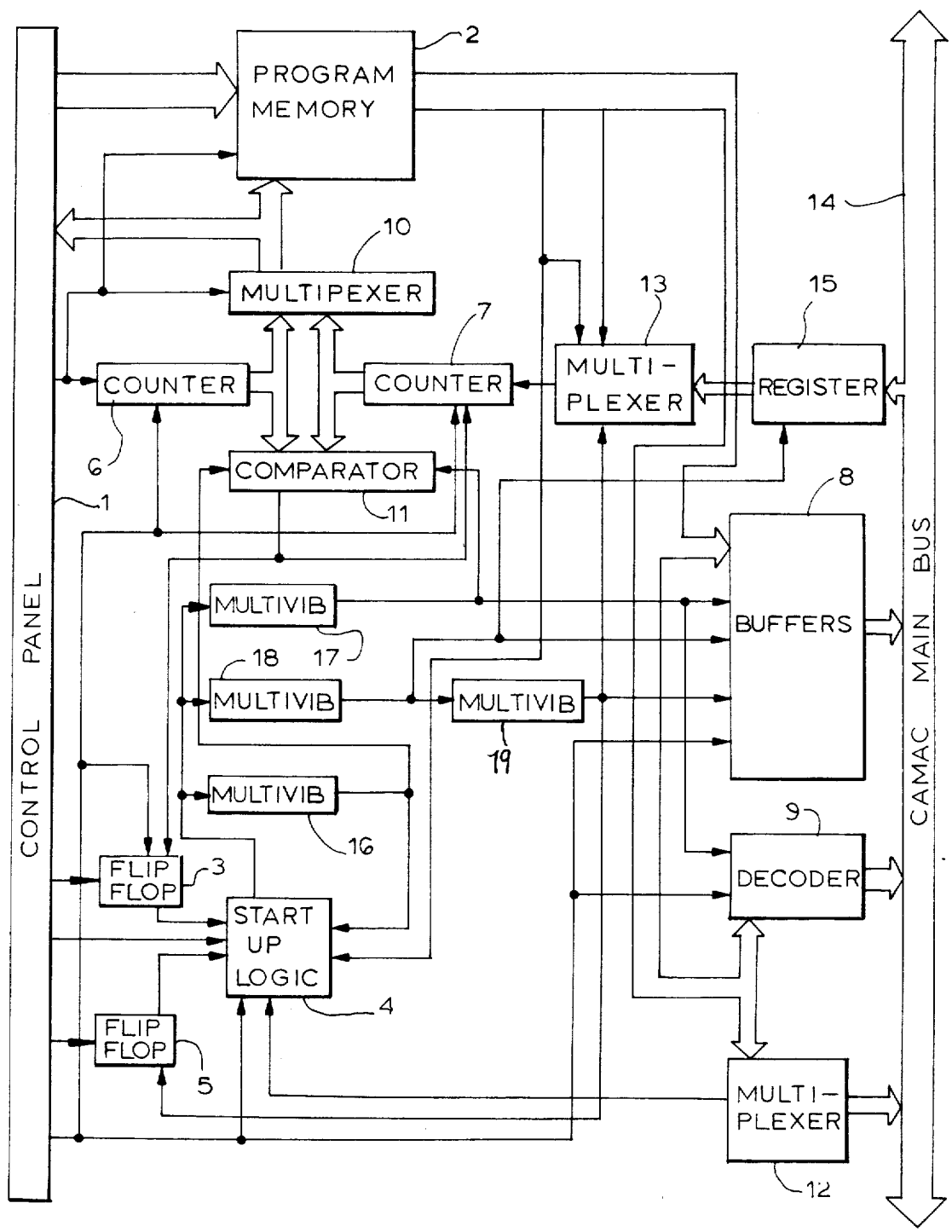
FIG. 1 is a block diagram of the control station of the manual crate controller.

The manual crate controller consists of a working and a control station, the latter containing a panel 1 with a program output connected to a program memory 2, a cycle output connected to the clock input of a D-flip-flop 3, an output for automatic operation connected to an input of a start-up logic 4, a single action output connected to the clock input of a second D-flip-flop 5, an initiation and resetting output connected to a second input of the start-up logic 4 and also to the R-input of the first D-flip-flop 3, to the resetting input of a first counter 6, to the resetting input of counter 7, to the input of a block with buffers 8, to the resolving input of a decoder 9 and the output for entering data from the panel 1, in turn, is connected to the clock input of the first counter 6, to the control input of a multiplexer 10 and to an input for loading the program memory 2. The outputs of the first counter 6 are connected to the first inputs of a comparator 11 and via the multiplexer 10 the first inputs of the program memory 2 and to the inputs of the indicators on the panel 1. The function and subaddress output of the program memory 2 is connected to the corresponding input of the block with buffers 8. Further, the outputs for number of the program memory 2 are connected to selector inputs of the decoder 9 and a second multiplexer 12. The output for normal mode of the program memory 2 is connected to a third input of the start-up logic 4, and to an input of a third multiplexer 13, and the output for repetition mode of the program memory 2 is connected to a second input of the third multiplexer 13. The buses for accepted command and response of the CAMAC-main bus 14 are connected to the D-inputs of a two-bit register 15, the outputs of which being connected to the third and the fourth input of the third multiplexer 13, the output of which is connected to the clock of the second counter 7. The second counter 7 has outputs connected to the second inputs of the first multiplexer 10 and to the second inputs of the comparator 11, its output being connected to the second resetting input of the second counter 7. The outputs of the first and the second D-flip-flops (3 and 5) are connected to a fourth and fifth input of the start-up logic 4, whose sixth input is connected to the output of the second multiplexer 12, the multiplexer 12 having inputs connected to the IRQ-buses of the CAMAC-main bus 14.

The output of the start-up logic 4 is connected to the inputs of monostable multivibrators 16 and 17 and also to the input of a delay line with monostable multivibrator 18, the output of which is connected to the input of a second delay line with monostable multivibrator 19.

The output of the first monostable multivibrator 16 is connected to a seventh input of the start-up logic 4 and to the resolving input of the comparator 11. The output of the second monostable multivibrator 17 is connected with the second resolving input of the comparator 11, and, further on, with the input for "BUSY" of the block with buffers 8, and with the second resolving input of the decoder 9, the decoder 9 having outputs connected to the buses for number of the CAMAC-main bus 14. The output of the first delay line with monostable multivibrator 18 is connected to the clock input of the two-bit register 15 and to the first-strobe input of the block with buffers 8. The output of the second delay line with monostable multivibrator 19 is connected to the resolving input of the third multiplexer 13, and is further connected to the resetting input of the second D-flip-flop 5 and to the second-strobe input of the block with buffers 8, the outputs of which are connected correspondingly to the buses for function, sub-address, initiation, resetting, prohibition, busy, first and second-strobe of the CAMAC-main bus 14.

Figure 2:
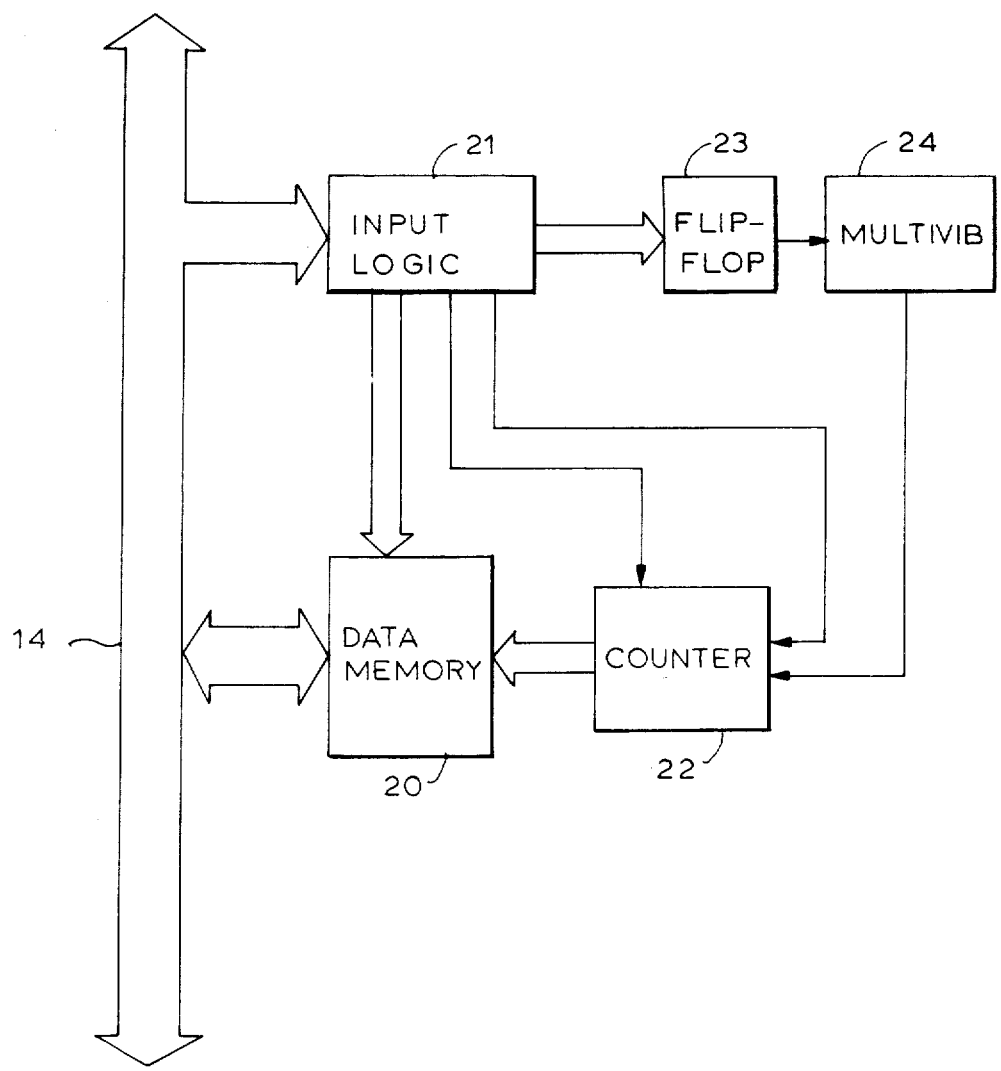
FIG. 2 is a block diagram of the working station of the manual crate controller.

The working station (FIG. 2) contains a data memory 20 with data inputs connected to the data buses of the CAMAC-main bus 14 and an input logic 21 with inputs connected to the two most significant buses for function, to the buses for busy, initiation, resetting, first and second-strobe of the CAMAC-main bus 14. The outputs of the input logic 21 are connected to the control inputs of the data memory 20, the resetting output, in turn, being connected to the resetting input of a third counter 22 having its clock input connected to the counter output of the input logic 21, the latter having its write/read outputs connected to the inputs of RS-flip-flop 23, the output of which is connected to a third monostable multivibrator 24, the output of which is connected, in turn, to the second resetting input of the third counter 22, its outputs being connected to the address inputs of the data memory 20.

The operation of the manual crate controller is as follows. By means of activating the signal for initiation and resetting from the panel 1, the following operations are performed, the first D-flip-flop 3 and the first and the second counter (6 and 7) are reset, the first and the second monostable multivibrators (16 and 17) and also the first delay line with monostable multivibrator 18 are activated through the second input of the start-up logic 4. The second monostable multivibrator 17, the first delay line with monostable multivibrator 18 and the second delay line with monostable multivibrator 19, activated by the first delay line with monostable multivibrator 18, produce the time related signals for busy, first-strobe and second-strobe in conformity with CAMAC-standard.

These signals, together with the signal for initiation and resetting, are passed through the buffers 8 to the CAMAC-main bus 14. The signal for initiation and resetting suppresses the passing of the number for module selection to the CAMAC-main bus 14 by means of the resolving input of the decoder 9. At the same time the signal for the second-strobe resets the second D-flip-flop 5. The received addressless command on the CAMAC-main bus 14 enters the input logic 21 of the working station and forces the resetting of the third counter 22 by means of its first R-input. In this way, the manual crate controller and the tested CAMAC-modules are set into their respective initial states. The desired command, entered by means of the keys on the panel 1, contains bits for function, sub-address, number of module, normal mode and repetition mode. The command from the command outputs of the panel 1 is loaded in the program memory 2 by means of activation of the output for entering data from the panel 1. That causes the addressing of the program memory 2 with the outputs of the first counter 6 via the selected first multiplexer 10 and loading the program memory 2. After the drop of the activation, the first counter 6 is incremented by a unit and is ready for loading the next command on a new address in the program memory 2. During the time of memory loading, the content of the first counter 6, showing the address of the memory cell that is being loaded, is indicated on the panel 1. After the drop of the signal for entering, the second counter 7, through the first multiplexer 10, addresses continuously the selected program memory 2, which is set in "read" mode, in this case. The panel 1 indicates the address of the command that will be performed. The first two monostable multivibrators 16 and 17, and the two delay lines with monostable multivibrators 18 and 19 are initiated on activation of the output of the start-up logic 4 in the modes for automatic operation, single action, or for cycle. As a result, the read-out content of the program memory 2, which comprises function, sub-address and number of module, is passed through the buffers 8 and through decoder 9 to the CAMAC-main bus 14 accompanied by the buffer signals for "BUSY" and for first and second-strobe. The read-out counter is also strobed by the signal for busy produced by the second monostable multivibrator 17. The command is sent to the CAMAC-main bus 14, if one of the outputs of panel 1, for automatic operation, for single action or for cycle, is activated. As a result, one of the equivalent inputs, accordingly the first, the fifth or the fourth one of the start-up logic 4, is activated. It is energized immediately if the signal on the third input of the start-up logic 4 from the program memory 2 points out that the mode of the forthcoming command is not normal, i.e. it is a repetition or stop. If the mode is normal, it should be noted that a specific condition on the sixth input must be present in order to energize the start-up logic 4. On this sixth input, an interrupt request is delayed and sent through the second multiplexer 12 from the module with a number pointed out on the outputs for number of the program memory 2, which are connected to the selector inputs of the second multiplexer 12. During the time of execution of the CAMAC-command, the state of the CAMAC-signals for accepted command or response is recorded on the first-strobe in the two-bit register 15. These signals are necessary for making a decision depending on the mode of data exchange—whether the command is to be repeated or switched over to the next one. The third multiplexer 13, realizing the function of the signals for mode from the program memory 2 and from the outputs for status of the two-bit register 15, determines whether the second-strobe on its resolving input is to be passed to the counter input of the second counter 7 for addressing the next command or not to be passed in order to repeat the already executed command. In the normal mode, it is only necessary that the accepted command be present in order to switch over to the next command, but in the repetition mode, the signal for response is also necessary. In the mode for stop, inversely coded from the mode for repetition, it is necessary to have the presence of accepted command and the absence of response in order to continue the execution of the sequence of commands. During automatic mode, the signal for automatic operation from panel 1 is delayed and the feeding of commands, after the first one, is accomplished at the seventh input of the start-up logic 4, which is activated after the end of the pulse produced from the first monostable multivibrator 16. The first monostable multivibrator 16 sends a pulse with duration a little longer than a pulse of the second monostable multivibrator 17, thus allowing the setting up of the program memory 2 outputs before the energizing of the start-up logic 4 from its seventh input. In this case, the energizing of the start-up logic 4 is accomplished immediately if a mode for repetition or for stop is present and also if the condition on the sixth input of the start-up logic 4 at normal mode is present. At the moment of the activation to the seventh input of the start-up logic 4, an interrupt request from the module for which the command is intended is held if the command subject to execution is in normal mode and the condition on the sixth input of the start-up logic 4 is absent. The output of the start-up logic 4 is activated upon the arrival of the interrupt request. The execution of the command that is on the outputs of the program memory 2 follows and also a new incrementing of the second address counter 7 takes place if the corresponding conditions are present. The commands are executed in the sequence in which they are recorded until the comparator 11 determines that the contents of the first and the second counters (6 and 7) are equal. In this case, the output of the comparator 11 is activated. It resets the second counter 7 and the execution of commands continues again from the zero address of the program memory 2. The activation or comparator 11 is enabled from its two resolving inputs after the end of the pulse of the second monostable multivibrator 17, but before the end of the pulse of the first monostable multivibrator 16. The signal "BUSY" produced by the second monostable multivibrator 17 suppresses the comparator 11 in order that it is not activated by the noise of the second counter 7 reswitching, taking place synchronously with the second-strobe. This suppressing is also done in order that the second counter 7 is not locked in its zero state, when the first counter 6 is reset. This may occur at the moment of initiation or resetting, or when the maximum number of commands stored in the program memory 2 equals the capacity of the first and the second counters (6 and 7). The counters 6, 7 switch from maximum to zero state after a pulse on their counter inputs. Their resetting inputs have priority over the counter inputs. The end of the pulse of the first monostable multivibrator 16 suppresses the comparator 11 in order that the first D-flip-flop 3 is not kept locked in its reset state from its second R-input. During single action, the single action output of the panel 1 is activated and energizes the second D-flip-flop 5, the output of which activates the fifth input of the start-up logic 4. Further on, the operation is the same as in the automatic operation except that it is performed only once, because immediately after the execution of the first command the second-strobe pulse resets the second D-flip-flop 5. In order to activate it again, it is necessary to apply an active front on its clock input, which is produced after releasing and re-pressing the pushbutton for single action on the panel 1. In the cycle mode, the operation is nearly the same, but now the first D-flip-flop 3 is reset by the comparator 11 after a single execution of all commands stored in the program memory 2. Since the second counter 7 is also reset, a new active front on the clock input of the first D-flip-flop 3 repeats the described operations from the zero address. The first and the second D-flip-flops (3 and 5) are synchronized and provide independence of operation of the device in single action mode and in cycle mode from the manual operation on the panel 1. The commands produced by the control station, fed to the CAMAC-main bus 14, control the tested CAMAC-modules. The information transfer between them is accomplished by means of the working station. It is a memory of the type "FIFO", which is set in "write" mode at the time of CAMAC-commands from the type "read" and in "read" mode during the CAMAC-commands from the type "write". If the input logic 21 discovers that a "write" command is transferred via the CAMAC-main bus 14, it, synchronously with the signal for busy, sets the data memory 20 in "read" mode and the "read-out" data from the data memory 20 are stored in the tested module. If a "read" command is passed through the CAMAC-main bus 14, the input logic 21 sets the data memory 20 in "write" mode and the data from the tested module are recorded in the data memory 20 at the time of the first-strobe. During "read" and "write" commands, the input logic 21, using the second-strobe, increments the contents of the third counter 22 which addresses the data memory 20 at the next reading or writing. The input logic 21 is not effected by commands not of the type "read" or "write" and the RS-flip-flop 23 remembers whether the last operation was reading or writing. If the RS-flip-flop 23 is turned, the third monostable multivibrator 24 is activated and resets the third counter 23 from its second resetting input before the appearance of the first-strobe. This is accomplished on the first command for reading after writing or on the first command for writing after reading. In this way the corresponding commands for reading and writing, address one and the same parts of the data memory 20.

We claim:

1. A manual crate controller, consisting of a control station and a working station, comprising a panel, a block of buffers, a decoder and a multiplexor, characterized in that the control station comprises the panel having command outputs connected to a program memory, an output for a cycle connected to the clock of a first D-flip-flop, an output for automatic operation connected to an input of a start-up logic, an output for single action connected to the clock input of a second D-flip-flop, an output for initiation and resetting which, in turn, is connected to a second input of the start-up logic and also to the R-input of the first D-flip-flop, to the resetting input of a first counter, to the resetting input of a second counter, to the input of the block of buffers, to the enable input of the decoder, and the output for entering data from the panel, in turn, is connected to the clock input of the first counter, to the control input of a first multiplexor and to an input for loading the program memory, as for the outputs of the first counter, they are connected to the first inputs of the first multiplexor, the outputs of which are connected to the inputs of the indicators on the panel and to the address inputs of the program memory whose function and subaddress outputs are connected to the corresponding inputs of the block of buffers, further, the outputs for number of the panel are connected to selector inputs of the decoder and to a second multiplexor, the panel output for normal mode being connected to a third input of the start-up logic and to an input of a third multiplexor, while the panel output for repetition mode is connected to a second input of the third multiplexor, whereas buses for accepted command and response of a CAMAC-main bus are connected to the D-inputs of a two-bit register, the outputs of which are connected to the third and the fourth input of the third multiplexor, the output thereof being connected to the clock of the second counter, the second counter having outputs connected to the second inputs of the first multiplexor and to the second inputs of the comparator, the output of which, in turn, is connected to the second resetty TM g input of the first D-flip-flop and to the second TM resetting input of the second counter, while the outputs of the first and the second D-flip-flops are connected to a fourth and fifth input of the start-up logic, whose sixth input is connected to the output of the second multiplexor, the second multiplexor having inputs connected to IRQ-buses of the CAMAC-main bus, and the output of the start-up logic being connected to the inputs of monostable multivibrators and also to the input of a delay line with monostable multivibrator, the output of which is connected to the input of a second delay line with monostable multivibrator, whereas the output of a first monostable multivibrator is connected to a seventh input of the start-up logic and to the enable input of the comparator, while the output of a second monostable multivibrator is connected with the second enable input of the comparator and, to the input for busy of the block of buffers and with the second enable input of the decoder, said decoder having outputs connected to buses for number of the CAMAC-main bus, while the output of the first delay line with monostable multivibrator is connected to the clock input of the two-bit register and to the first-strobe input of the block of buffers, and the output of the second delay line with monostable multivibrator is connected to the enable input of the third multiplexor and is further connected to the R-input of the second D-flip-flop and to the second-strobe input of the block of buffers, the outputs of which are connected correspondingly to buses for function, sub-address, initiation, resetting, prohibition, busy, first and second-strobe of the CAMAC-main bus, while the working station comprises a data memory with data inputs connected to data buses of the CAMAC-main bus and an input logic with inputs connected to a main write/read bus, to the buses for busy, initiation, resetting, first and second-strobe of the CAMAC-main bus, while the outputs of the input logic are connected to the control inputs of the data memory, the resetting output in turn, being connected to the resetting input of a third counter, having its clock input connected to the counter output of the input logic, the input logic having its write/read outputs connected to the inputs of an RS-flip-flop, having an output connected to a third monostable multivibrator, whose output is connected, in turn, to the second resetting input of a third counter, the outputs of which are connected to the address input of the data memory.

* * * * *